United States Patent
Chang

(10) Patent No.: US 6,433,328 B1
(45) Date of Patent: Aug. 13, 2002

(54) STRAY LIGHT ATTENUATING DEVICE

(75) Inventor: Tsanghuai Chang, Changhua Hsien (TW)

(73) Assignee: Umax Data Systems, Inc., Hsinchu (TW)

( * ) Notice: Subject to any disclaimer, the term of this patent is extended or adjusted under 35 U.S.C. 154(b) by 23 days.

(21) Appl. No.: 09/632,676

(22) Filed: Aug. 7, 2000

(51) Int. Cl.[7] ............................. H01J 3/14; H01J 5/02; H01L 27/00

(52) U.S. Cl. ............... 250/216; 250/208.1; 250/234; 250/239

(58) Field of Search ...................... 250/239, 216, 250/234, 235, 236, 208.1

(56) References Cited

U.S. PATENT DOCUMENTS 4,644,159 A * 2/1987 Miura ........................ 250/239
6,097,026 A * 8/2000 Tsai ........................... 250/239

* cited by examiner

*Primary Examiner*—Stephone Allen
(74) *Attorney, Agent, or Firm*—J.C. Patents

(57) ABSTRACT

A stray-light attenuating device for removing stray light from a scanner. The attenuating device includes a light source, a lens, a reflecting mirror, a light sensor, a front cover plate and a back cover plate. The light source provides a beam of light for illuminating a document on the scanner. Light from the light source impinges upon the document and reflects to the reflecting mirror. The reflecting mirror deflects the reflected light to the lens. The lens focuses the reflected light onto the optical sensor to form an image. The optical sensor at least includes a plurality of connecting leads, a sensing surface and a backside. The back cover plate having an opening thereon is used for covering the backside of the optical sensor. The front cover plate having a window thereon is used for covering the sensing surface of the optical sensor.

15 Claims, 3 Drawing Sheets

STRAY LIGHT ATTENUATING DEVICE

BACKGROUND OF THE INVENTION

1. Field of Invention

The present invention relates to a stray-light attenuating device. More particularly, the present invention relates to a stray-light attenuating device for a scanner.

2. Description of Related Art

Scanner is a common peripheral device in a computer system. Most platform type of scanners consists of a charge-coupled device (CCD) and a scanning drive system that commonly uses a stepping motor. In some applications, the CCD is fixed onto the scanning drive system so that a document is directly scanned. Alternatively, the CCD is fixed onto a stationary frame with light transmitted to the CCD via a set of optical lenses mounted on the scanning drive system.

In general, a CCD is able to take in a scanning line or a horizontal line of image data in each read operation. Each scanning line comprises of a plurality of pixels. Resolution of the scanning line depends on the density of CCD sensors. This type of resolution is commonly referred to as the horizontal resolution or the optical resolution. In the vertical direction, scanning is conducted through the driven CCD or driven optical lens system. Resolution is closely related to the step angle of the stepping motor and the accuracy of scanning drive system. This type of resolution is commonly referred to as the vertical resolution or the motor resolution. By conducting a vertical scanning, data from a number of horizontal lines are obtained. All line data can be subsequently combined to form a complete image.

Due to increasing demands for clearer image quality, scanners of higher resolution are always in need. In an image scanning operation, stray light is often one of the main causes of the lowering of signal power leading to poorer image resolution. Methods that can prevent the generation of stray light or remove any generated stray light is able to increase the signal-to-noise ratio and hence the quality of a scanner.

FIGS. 1 and 2 are cross-sectional side views of conventional stray-light attenuating devices in a scanner. As shown in FIG. 1, a plurality of stopping plates 114 is attached to the interior sidewalls of the scanner 100. A light source 106 emits a beam of light onto a document 120 to produce a reflected light 110. The light 110 is reflected by a reflecting mirror 108 to a lens 104. The lens 108 focuses the reflected light 110 onto an optical sensor 102 to produce an image. The optical sensor 102 can be a charge-coupled device (CCD). Stray light 112a from the light source 106 is reflected by the reflecting mirror 108 to the stopping plates 114. Stopping plates 114 is capable of dissipating stray light 112a, thereby serving as an isolator preventing any stray light 112a from passing through the lens 104 to the optical sensor 102. However, the stopping plates 114 is rather useless for stopping the passing of stray light 112b through the gaps between stopping plates 114 into the lens 104, thereby affecting image quality on the optical sensor 102.

As shown in FIG. 2, an alternative method of eliminating stray light is to add a few stopping plates 214a~214c between lens 204 and optical sensor 202. The stopping plates 214a~214c are attached to scanner 200. The stopping plates are erected in such a way that the plates closer to the optical sensor 202 such as stopping plate 214c have a greater height than the plates further out such as stopping plate 214a. Although this arrangement of stopping plates is able to filter most of the stray light 212b, a portion of stray light 212a still disperses into the optical sensor 202 affecting the quality of the image.

SUMMARY OF THE INVENTION

Accordingly, one object of the present invention is to provide a straylight attenuating device capable of preventing any stray light from entering charge-coupled device so that signal-to-noise ratio and hence quality of a captured image is increased.

To achieve these and other advantages and in accordance with the purpose of the invention, as embodied and broadly described herein, the invention provides a straylight attenuating device for removing stray light from a scanner. The attenuating device includes a light source, a lens, a reflecting mirror, a light sensor, a front cover plate and a back cover plate. The light source provides a beam of light for illuminating a document on the scanner. Light from the light source impinges upon the document and reflects to the reflecting mirror. The reflecting mirror turns the reflected light to the lens. The lens focuses the reflected light onto the optical sensor to form an image. The optical sensor can be a charge-coupled device having at least a plurality of connecting leads, a sensing surface and a backside. The back cover plate having an opening thereon is used for covering the backside of the optical sensor. The front cover plate having a window thereon is used for covering the sensing surface of the optical sensor.

According to this invention, a front cover plate is mounted onto the sensing surface of the optical sensor. A window on the front cover plate permits only the reflected light necessary for forming the image into the optical sensor. Efficiency of removing the stray light is increased the closer the front cover plate is moved towards the optical sensor. Hence, the front cover plate is either glued to the optical sensor or fastened to the back cover plate using a set of screws for easy assembling.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
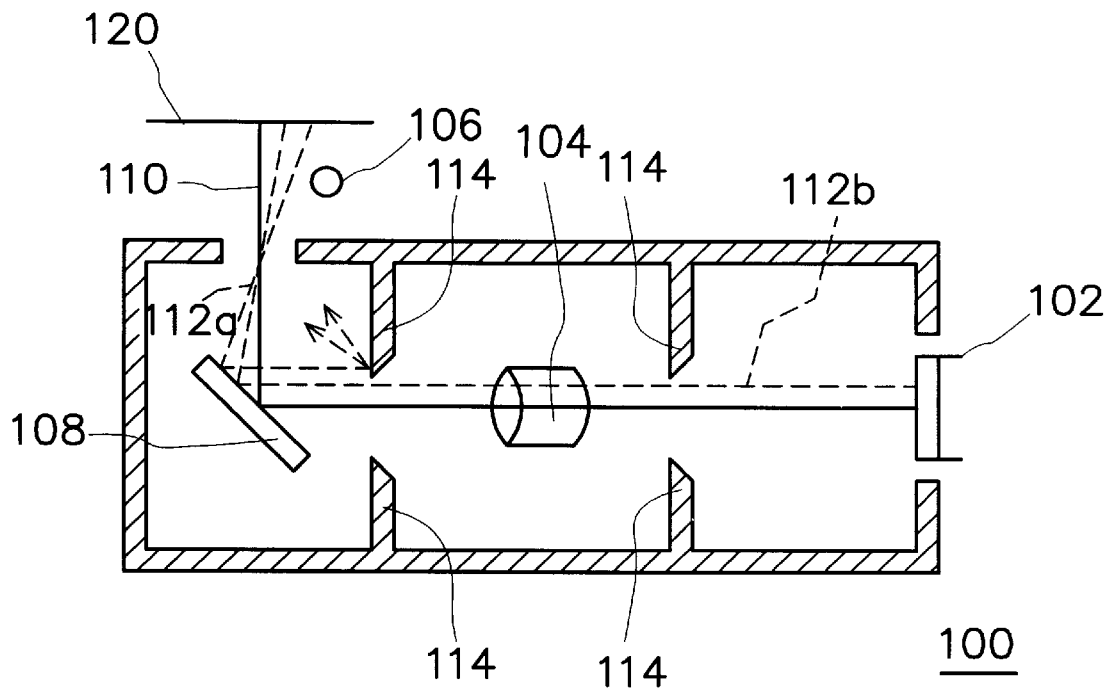
FIGS. 1 and 2 are cross-sectional side views of conventional stray-light attenuating devices in a scanner.
Figure 2:
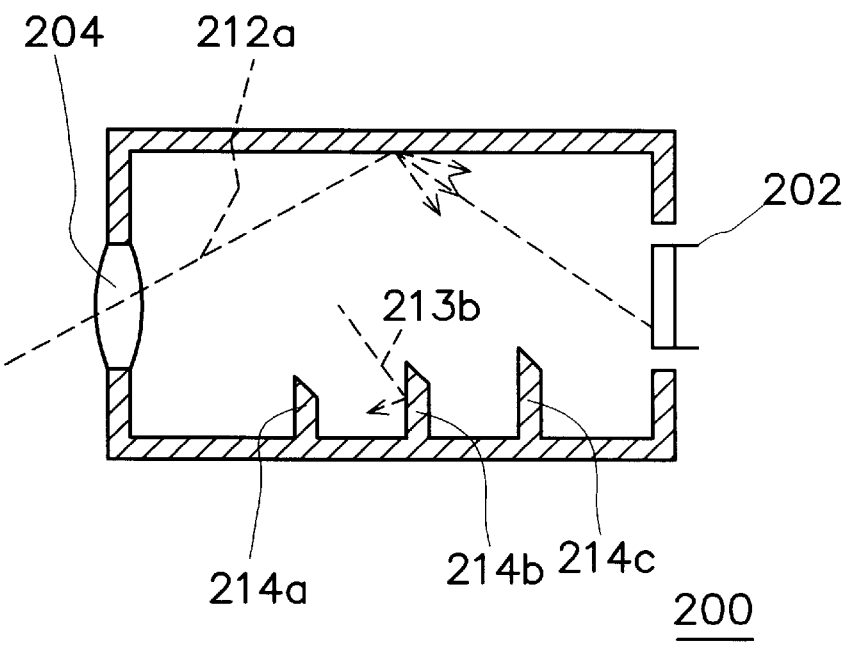

Reference will now be made in detail to the present preferred embodiments of the invention, examples of which are illustrated in the accompanying drawings. Wherever possible, the same reference numbers are used in the drawings and the description to refer to the same or like parts.

Figure 3:
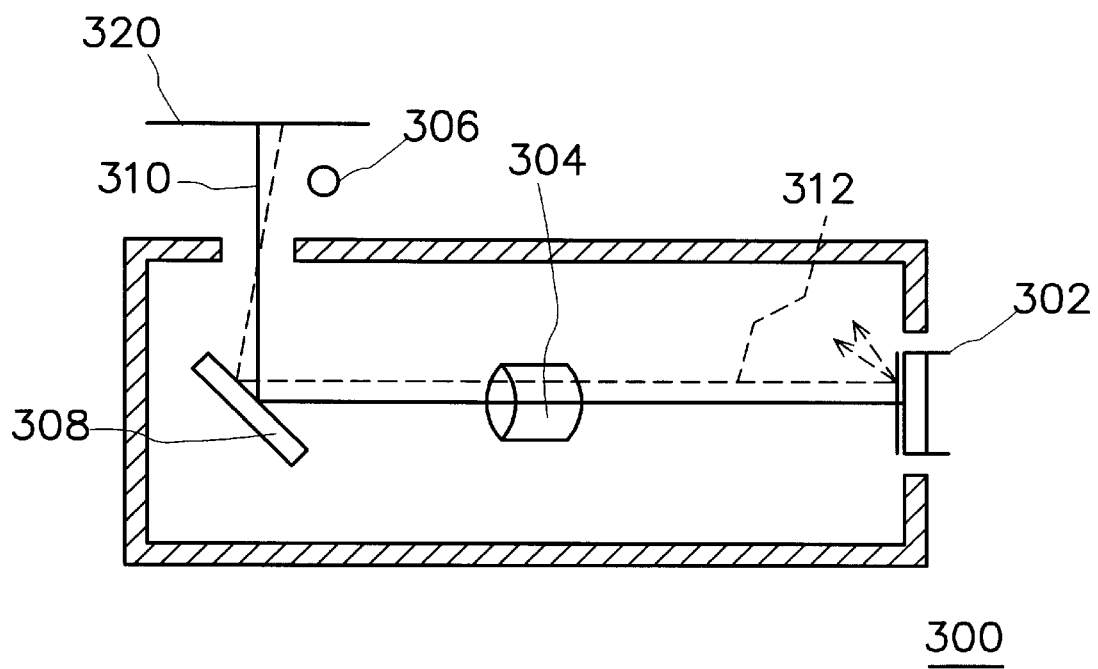
FIG. 3 is a cross-sectional side view of a stray-light attenuating device according to one preferred embodiment of this invention.
Figure 4:
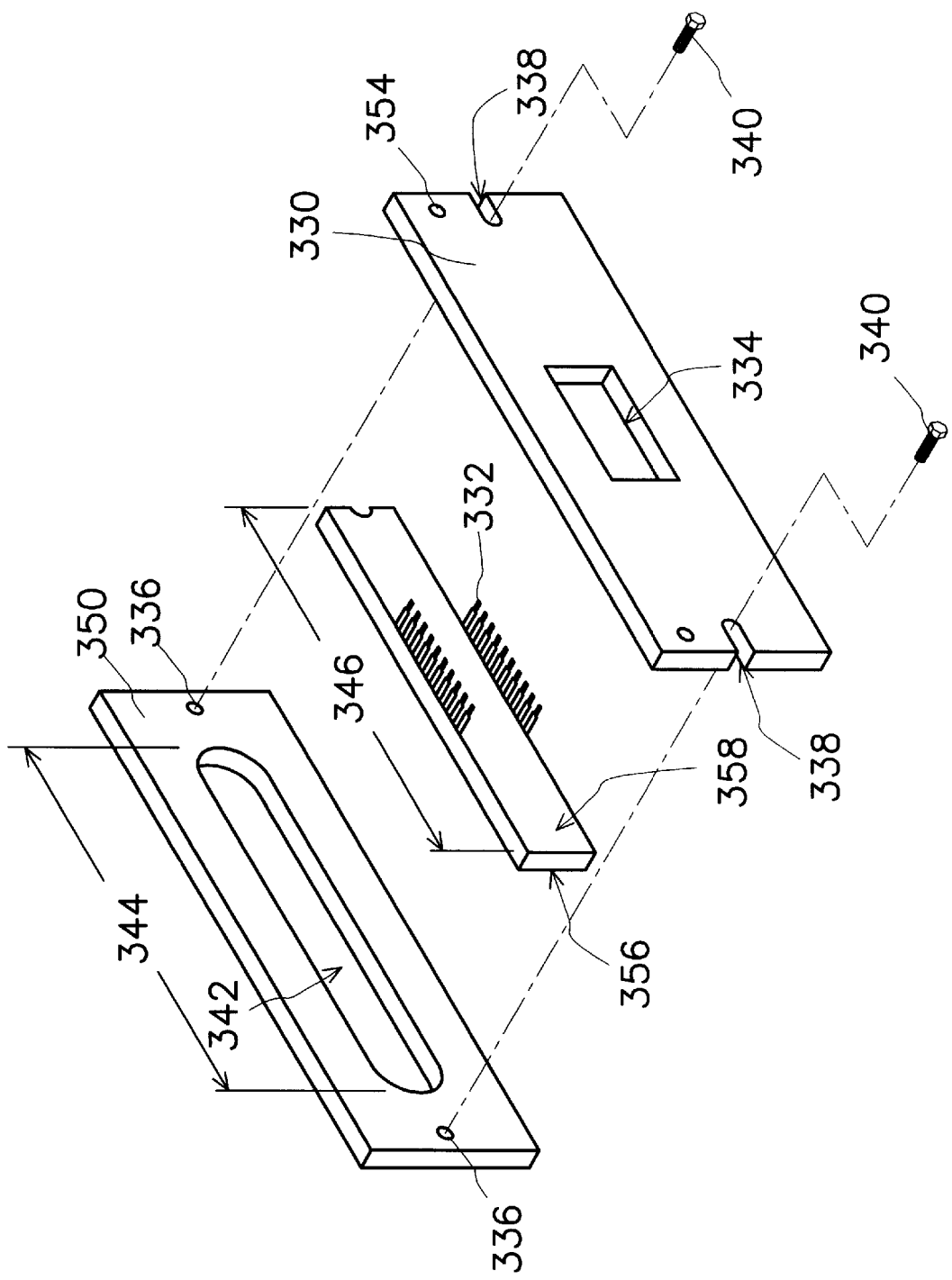
FIG. 4 is a perspective view showing the components of the stray-light attenuating device according to this invention.

FIG. 3 is a cross-sectional side view of a stray-light attenuating device according to one preferred embodiment of this invention. FIG. 4 is a perspective view showing the components of the stray-light attenuating device according to this invention.

As shown in FIGS. 3 and 4, the stray-light attenuating device of this invention can be applied to a scanner 300 for removing stray light. The attenuating device at least includes a light source 306, a lens 304, a reflecting mirror 308, an optical sensor 302, a front cover plate 350 and a back cover plate 330 (details of the front cover plate 350 and the back cover plate 330 are shown in FIG. 4). The light source 306 such as a fluorescent tube provides the light necessary for illuminating a document 320 on the scanner 300. Light from the light source 306 impinges upon the document 320 and reflects to the reflecting mirror 308. The reflecting mirror 308 turns the reflected light 310 to the lens 304. The lens 304 focuses the reflected light 310 onto the optical sensor 302 such as a charge-coupled device (CCD) to form an image. One major aspect of this invention is the placement of front cover plate 350 in front of the optical sensor 302 so that stray light 312 outside the reflected light 310 is filtered away.

As shown in FIG. 4, the optical sensor 302 at least includes a plurality of connecting leads 332, a sensing surface 356 and a back surface 358 on the other side of the sensing surface 356. The back cover plate 330 at least includes an opening 334 and a plurality of open holes 338 and 354. The connecting leads 332 of the optical sensor 302 pass through the opening 334. In fact, the connecting leads 332 are output terminals that transmit image data to computer for further image processing.

The front cover plate 350 covers the sensing surface 356 of the optical sensor 302. The front cover plate 350 at least includes a window 342 having a width 344. The window 342 permits only the reflected light 310 necessary for forming image to enter so that the entire sensing surface 356 of the optical sensor 302 is utilized. Furthermore, the window 342 on the front cover plate 350 is a full exposure type without any transparent plate. Therefore, the front cover plate 350 is very effective in stopping any stray light 312 (shown in FIG. 3) outside the reflected light 310 and quality of the scan image can be maintained.

The open holes 338 on the back cover plate 330 are designed as elongated slots. Hence, screws 340 can easily pass through the back cover plate 330, the optical sensor 302, the front cover plate 350 and engage with threaded holes 336 on the front cover plate 350. Moreover, passing screws 340 through the elongated slots 338 is able to fasten the back cover plate 330 to the scanner 300. In addition, efficiency of stray light removal increases with a decrease in the separation between the front cover plate 350 and the optical sensor 302. Consequently, to increase efficiency, the front cover plate 350 is preferably glued to the optical sensor 302. Alternatively, the front cover plate 350 is fastened to the back cover plate 330 using a set of screws 340 for easy assembling.

In summary, the advantages of this invention includes:

1. The stray-light attenuating device of this invention is able to stop stray light from entering the charge-coupled device so that signal-to-noise ratio and hence image quality is increased.

2. By simply putting a front cover plate having a window thereon in front of the optical sensor, only reflected light necessary for forming a scan image is permitted into the optical sensor. Furthermore, efficiency of stray light removal increases with a decrease in separation between the front cover plate and the optical sensor.

3. The front cover plate of used for stray light removal can be directly attached to the optical sensor or screwed to the back cover plate for easy assembly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stray-light attenuating device for removing stray light from a scanner, comprising:

a light source for illuminating a document on the scanner and producing a reflected light;

an optical sensor at least having a plurality of connecting leads, a sensing surface and a backside on the other side of the sensing surface;

a lens for focusing the reflected light onto the optical sensor;

a reflecting mirror for reflecting the reflected light from the document to the lens;

a back cover plate having an opening and a plurality of open holes thereon for covering the backside of the optical sensor such that the connecting leads of the optical sensor pass through the opening for outputting data to the scanner; and a front cover plate having a window thereon for covering the sensing surface of the optical sensor.

2. The attenuating device of claim 1, wherein the window permits only reflected light necessary for forming image into the optical sensor.

3. The attenuating device of claim 1, wherein the device further includes a plurality of screws for fastening the front cover plate, the back cover plate and the optical sensor.

4. The attenuating device of claim 3, wherein the screws pass through the open holes of the back cover plate and engaged with threaded holes on the front cover plate.

5. The attenuating device of claim 1, wherein the optical sensor includes a charge-coupled device.

6. The attenuating device of claim 1, wherein the open holes on the back cover plate includes elongated slot holes.

7. The attenuating device of claim 1, wherein the window on the front cover plate is of the full expose type without any transparent cover.

8. The attenuating device of claim 1, wherein the light source includes a fluorescent tube.

9. A stray-light attenuating device for removing stray light from a scanner, comprising:

an optical sensor at least having a plurality of connecting leads, a sensing surface and a backside on the other side of the sensing surface;

a back cover plate having an opening and a plurality of open holes thereon for covering the backside of the optical sensor such that the connecting leads of the optical sensor pass through the opening for outputting data to the scanner; and a front cover plate having a window thereon for covering the sensing surface of the optical sensor.

10. The attenuating device of claim 9, wherein the window permits only reflected light necessary for forming image into the optical sensor.

11. The attenuating device of claim 9, wherein the device further includes a plurality of screws for fastening the front cover plate, the back cover plate and the optical sensor.

12. The attenuating device of claim 11, wherein the screws pass through the open holes of the back cover plate and engaged with threaded holes on the front cover plate.

13. The attenuating device of claim 9, wherein the optical sensor includes a charge-coupled device.

14. The attenuating device of claim 9, wherein the open holes on the back cover plate includes elongated slot holes.

15. The attenuating device of claim 9, wherein the window on the front cover plate is of the full expose type without any transparent cover.

* * * * *